(12) United States Patent
Lavoie et al.

(10) Patent No.: US 11,542,599 B2
(45) Date of Patent: Jan. 3, 2023

(54) METHOD AND APPARATUS FOR PROVIDING STATION TO STATION UNIFORMITY

(71) Applicant: Lam Research Corporation, Fremont, CA (US)

(72) Inventors: Adrien Lavoie, Newberg, OR (US); Pulkit Agarwal, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 52 days.

(21) Appl. No.: 17/020,001

(22) Filed: Sep. 14, 2020

(65) Prior Publication Data

US 2020/0407847 A1 Dec. 31, 2020

Related U.S. Application Data

(62) Division of application No. 16/115,970, filed on Aug. 29, 2018, now Pat. No. 10,801,109.

(51) Int. Cl.
| | |
|---|---|
| *C23C 16/455* | (2006.01) |
| *H01L 21/02* | (2006.01) |
| *C23C 16/40* | (2006.01) |
| *H01L 21/66* | (2006.01) |

(52) U.S. Cl.
CPC ...... *C23C 16/45544* (2013.01); *C23C 16/402* (2013.01); *H01L 21/0228* (2013.01); *H01L 21/02164* (2013.01); *H01L 22/12* (2013.01)

(58) Field of Classification Search
CPC ............ C23C 16/45544; C23C 16/402; C23C 16/45561; C23C 16/505; C23C 16/52; C23C 16/45536; C23C 16/45546; C23C 16/45548; C23C 16/45574; C23C 16/54; H01L 21/02164; H01L 21/0228; H01L 22/12; H01L 21/67017; H01L 22/20
See application file for complete search history.

(56) References Cited

U.S. PATENT DOCUMENTS

| | | | |
|---|---|---|---|
| 4,987,856 A | 1/1991 | Hey et al. | |
| 6,143,082 A | 11/2000 | McInerney et al. | |
| 2009/0206056 A1 | 8/2009 | Xu et al. | |
| 2018/0277402 A1* | 9/2018 | Kawakami | ........ H01L 21/67069 |

(Continued)

FOREIGN PATENT DOCUMENTS

| | | | | |
|---|---|---|---|---|
| JP | 2006-307346 | | 11/2006 | |
| JP | 2020004931 A | * | 1/2020 | ....... C23C 16/45544 |

(Continued)

OTHER PUBLICATIONS

Restriction Requirement from U.S. Appl. No. 16/115,970 dated Nov. 6, 2019.

(Continued)

*Primary Examiner* — Edward Chin
(74) *Attorney, Agent, or Firm* — Beyer Law Group LLP

(57) ABSTRACT

An apparatus for processing stacks is provided. A first gas source is provided. A first gas manifold is connected to the first gas source. A first processing station has a first gas outlet, wherein the first gas outlet is connected to the first gas manifold. A first variable conductance valve is between the first gas source and the first gas outlet along the first gas manifold.

3 Claims, 6 Drawing Sheets

(56) References Cited

U.S. PATENT DOCUMENTS

2018/0301342 A1  10/2018  Fukazawa et al.
2020/0071826 A1   3/2020  Lavoie et al.

FOREIGN PATENT DOCUMENTS

KR        20170003407 A  *  1/2017
KR    10-2017-0125258       11/2017

OTHER PUBLICATIONS

Office Action from U.S. Appl. No. 16/115,970 dated Feb. 28, 2020.
Notice of Allowance from U.S. Appl. No. 16/115,970 dated Jun. 12, 2020.
International Search Report and Written Opinion from International Application No. PCT/US2019/046171 dated Sep. 15, 2020.

* cited by examiner

METHOD AND APPARATUS FOR PROVIDING STATION TO STATION UNIFORMITY

CROSS REFERENCE TO RELATED APPLICATION

This application is a divisional of U.S. application Ser. No. 16/115,970 filed on Aug. 29, 2018, the entire content of which is incorporated herein by reference thereto.

BACKGROUND

The present disclosure relates to the formation of semiconductor devices. More specifically, the disclosure relates to the formation of semiconductor devices in a system where a multiple stations share a gas source.

SUMMARY

To achieve the foregoing and in accordance with the purpose of the present disclosure, an apparatus for processing substrates is provided. A first gas source is provided. A first gas manifold is connected to the first gas source. A second gas manifold is connected to the first gas source. A first processing station has a first gas outlet, wherein the first gas outlet is connected to the first gas manifold. A second processing station has a second gas outlet, wherein the second gas outlet is connected to the second gas manifold. A first variable conductance valve is between the first gas source and the first gas outlet along the first gas manifold. A second variable conductance valve is between the first gas source and the second gas outlet along the second gas manifold.

In another manifestation, an apparatus for processing stacks is provided. A first gas source is provided. A first gas manifold is connected to the first gas source. A first processing station has a first gas outlet, wherein the first gas outlet is connected to the first gas manifold. A first variable conductance valve is between the first gas source and the first gas outlet along the first gas manifold.

In another manifestation, a method of processing a plurality of stacks, in a processing system comprising first gas source, a first gas manifold connected to the first gas source, a second gas manifold connected to the first gas source, a first processing station with a first gas outlet, wherein the first gas outlet is connected to the first gas manifold, a second processing station with a second gas outlet, wherein the second gas outlet is connected to the second gas manifold, a first variable conductance valve between the first gas source and the first gas outlet along the first gas manifold, a second variable conductance valve between the first gas source and the second gas outlet along the second gas manifold, a first mixing manifold between the first gas manifold and the first gas outlet, wherein the first variable conductance valve is between the first gas source and the first mixing manifold, a second mixing manifold between the second gas manifold and the second gas outlet, wherein the second variable conductance valve is between the first gas source and the second mixing manifold, a second gas source, a third gas manifold connected between the second gas source and the first mixing manifold, a fourth gas manifold connected between the second gas source and the second mixing manifold, a third variable conductance valve connected between second gas source and the first mixing manifold along the third gas manifold, a fourth variable conductance valve connected between the second gas source and the second mixing manifold along the fourth gas manifold, a fifth variable conductance valve between the first mixing manifold and the first gas outlet, and a sixth variable conductance valve between the second mixing manifold and the second gas outlet, the method comprising adjusting the first variable conductance valve, the second variable conductance valve, the third variable conductance valve, the fourth variable conductance valve, the fifth variable conductance valve, and the sixth variable conductance valve to provide improved uniformity between the first processing station and the second processing station.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
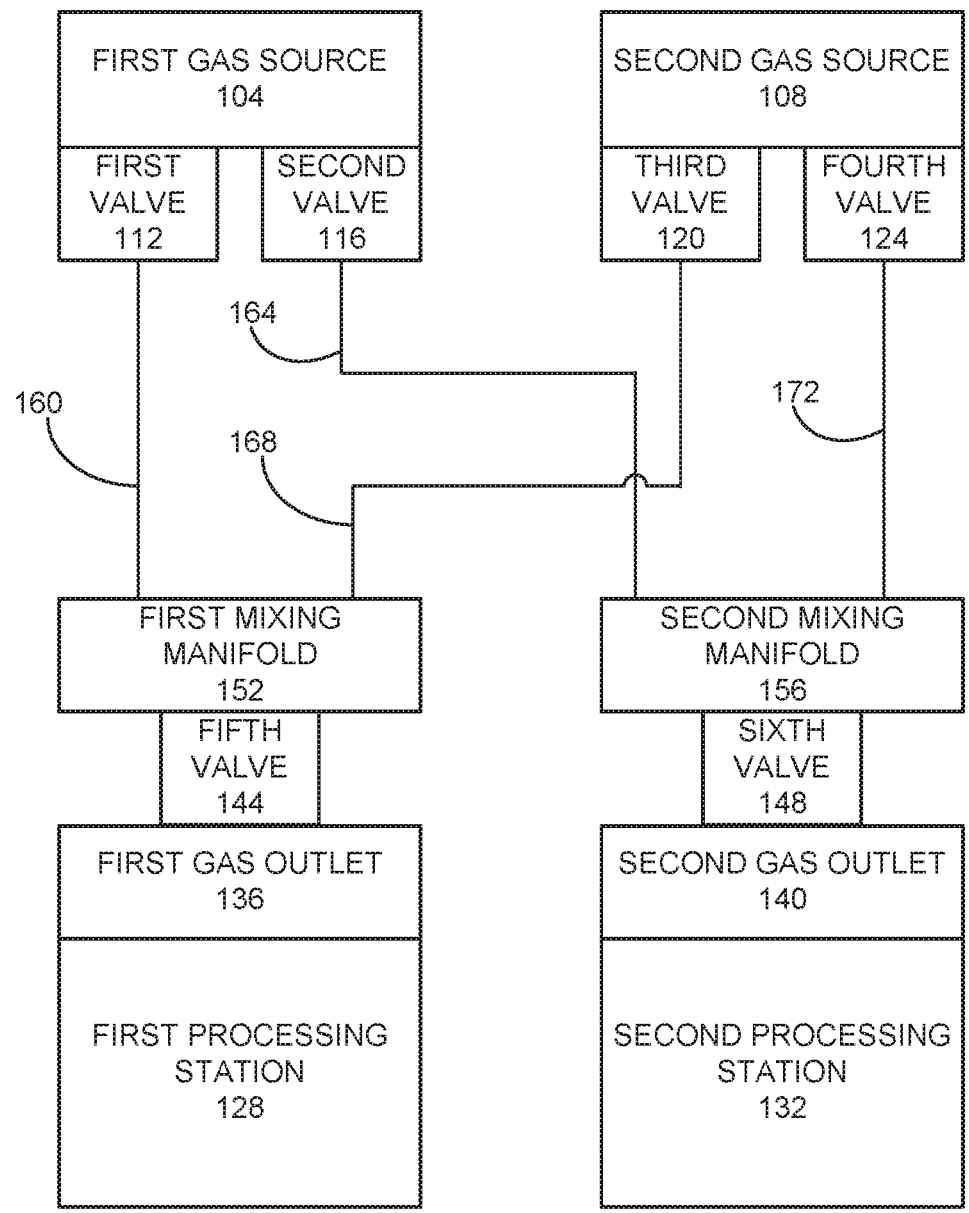
FIG. 1 is a schematic illustration of an embodiment.

FIG. 1 is a schematic illustration of an embodiment. In this example, a system is provided with a first gas source 104 and a second gas source 108. The first gas source 104 is connected to a first variable conductance valve 112 and a second variable conductance valve 116. A variable conductance valve is a valve that provides an adjustable flow resistance. The second gas source 108 is connected to a third variable conductance valve 120 and a fourth variable conductance valve 124. The system further comprises a first processing station 128 and a second processing station 132. The first processing station 128 has a first gas outlet 136. The second processing station 132 has a second gas outlet 140. A fifth variable conductance valve 144 is connected to the first gas outlet 136. A sixth variable conductance valve 148 is connected to the second gas outlet 140. A first mixing manifold 152 is connected to the fifth variable conductance valve 144. A second mixing manifold 156 is connected to the sixth variable conductance valve 148. A first manifold 160 is connected between the first variable conductance valve 112 and the first mixing manifold 152. A second manifold 164 is connected between the second variable conductance valve 116 and the second mixing manifold 156. A third manifold 168 is connected between the third variable conductance valve 120 and the first mixing manifold 152. A fourth manifold 172 is connected between the fourth variable conductance valve 124 and the second mixing manifold 156. In this paragraph, the connections are fluid connections which allow a fluid to pass from a first item to a second item. For example, since the first mixing manifold 152 is connected to the fifth variable conductance valve 144, fluid, such as a gas, is able to pass from the first mixing manifold 152 to the fifth variable conductance valve 144. In addition, since fluid can pass from the first variable conductance valve 112 to the first gas outlet 136 through the first manifold 160, the first mixing manifold 152, and the fifth variable conductance valve 144 the first variable conductance valve 112 is connected to the first gas outlet 136.

Figure 2:
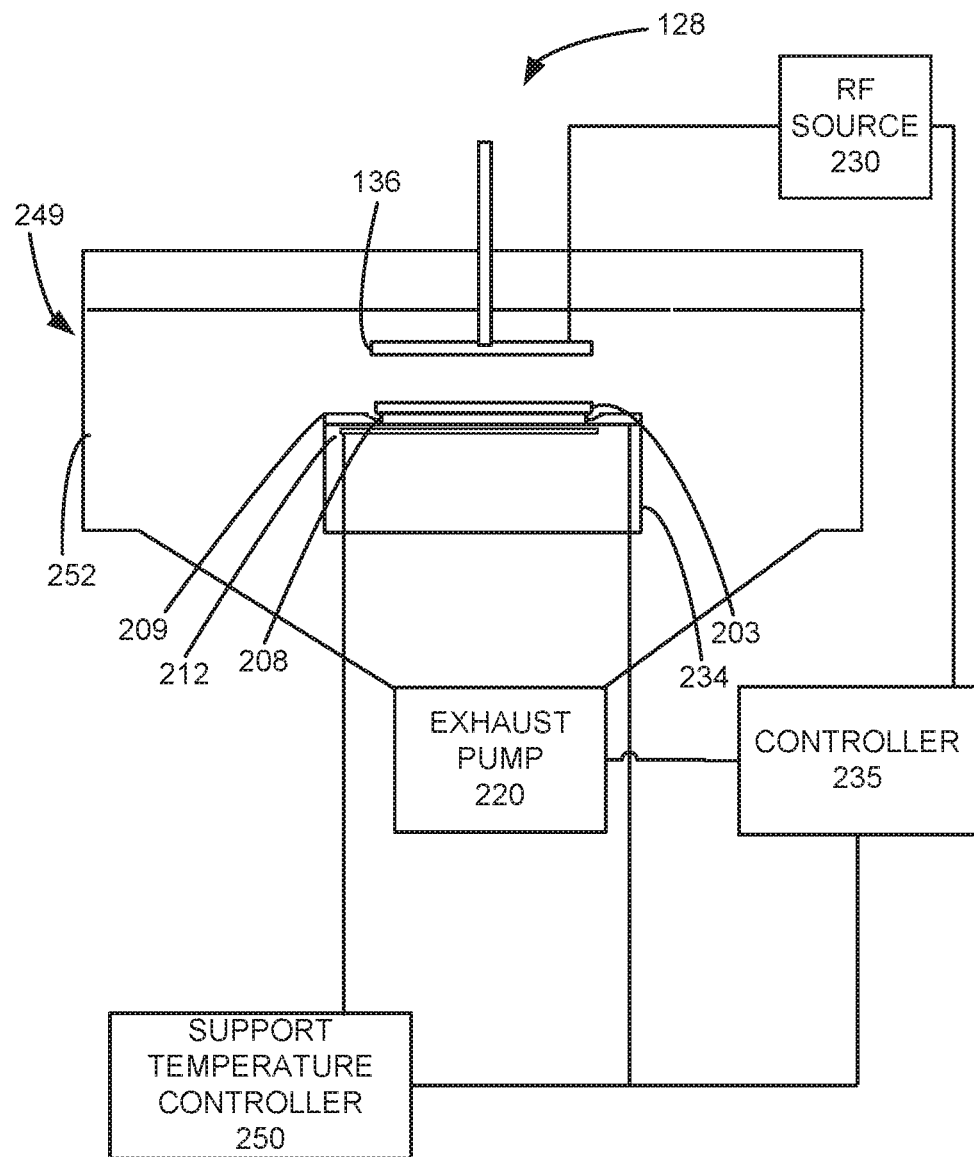
FIG. 2 is a schematic view of a process chamber that may be used in an embodiment.

FIG. 2 is a schematic view of a process chamber which may be used in an embodiment for the first processing station 128. In one or more embodiments, the first processing station 128 comprises the first gas outlet 136 in the form of a distribution plate and a wafer support 208, within a chamber 249, enclosed by a chamber wall 252. Within the chamber 249, a substrate 203 is positioned over the wafer support 208. An edge ring 209 surrounds the wafer support 208. A support temperature controller 250 is connected to the wafer support 208. A radio frequency (RF) source 230 provides RF power to an upper electrode, which in this embodiment is the first gas outlet 136. In an exemplary embodiment, 400 kHz, 13.56 MHz, and optionally 2 MHz, 27 MHz power sources make up the RF source 230. In this embodiment, the wafer support 208 is grounded. In this embodiment, one generator is provided for each frequency. In other embodiments, the generators may be in separate RF sources, or separate RF generators may be connected to different electrodes. For example, the upper electrode may have inner and outer electrodes connected to different RF sources. Other arrangements of RF sources and electrodes may be used in other embodiments. A controller 235 is controllably connected to the RF source 230, an exhaust pump 220, and the gas source 210. An example of such a chamber is the Striker™ Oxide system manufactured by Lam Research Corporation of Fremont, Calif.

Figure 3:
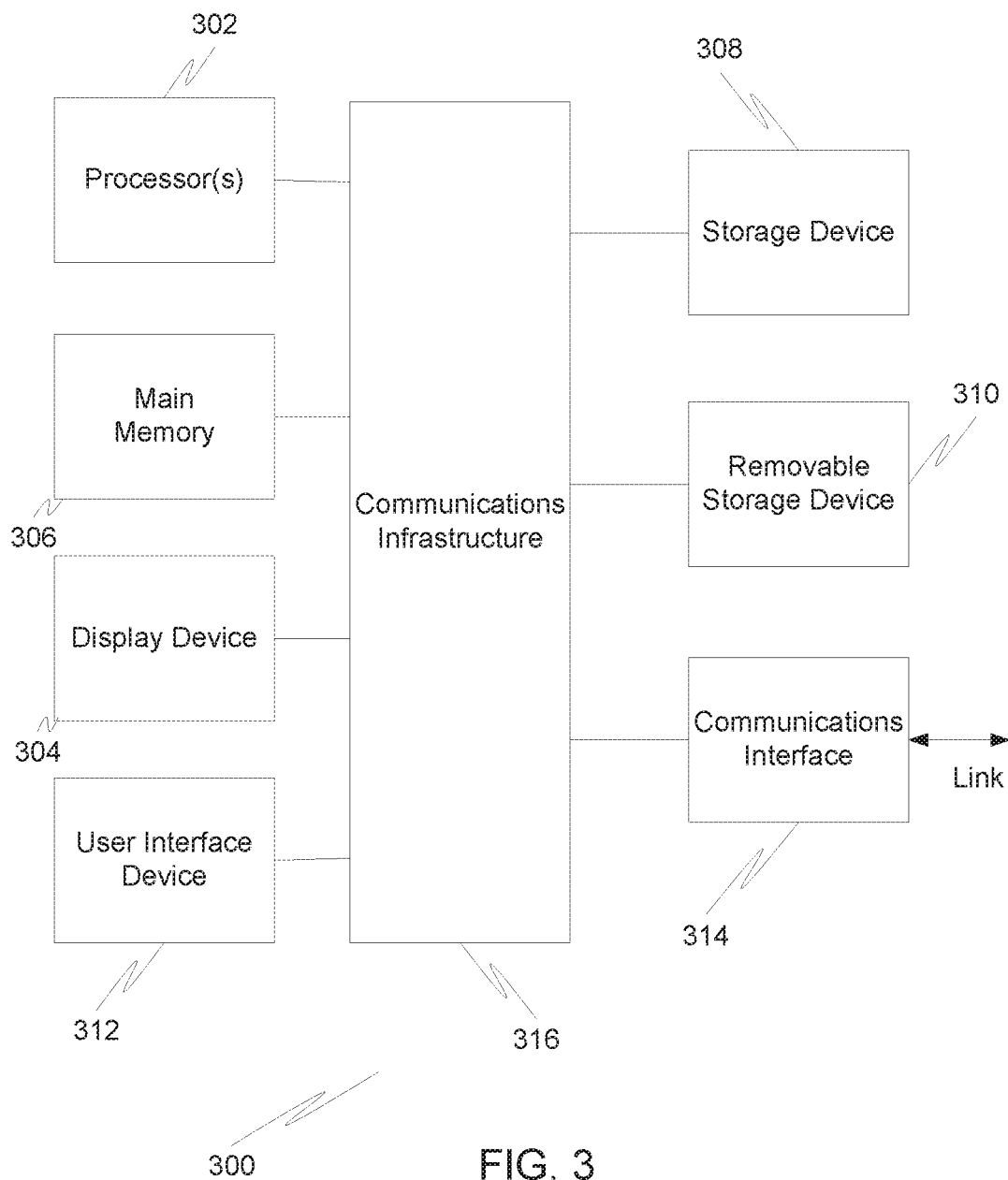
FIG. 3 is a schematic view of a computer system that may be used in practicing an embodiment.

FIG. 3 is a high level block diagram showing a computer system 300, which is suitable for implementing a controller 235 used in embodiments. The computer system may have many physical forms ranging from an integrated circuit, a printed circuit board, and a small handheld device up to a huge super computer. The computer system 300 includes one or more processors 302, and further can include an electronic display device 304 (for displaying graphics, text, and other data), a main memory 306 (e.g., random access memory (RAM)), storage device 308 (e.g., hard disk drive), removable storage device 310 (e.g., optical disk drive), user interface devices 312 (e.g., keyboards, touch screens, keypads, mice or other pointing devices, etc.), and a communications interface 314 (e.g., wireless network interface). The communications interface 314 allows software and data to be transferred between the computer system 300 and external devices via a link. The system may also include a communications infrastructure 316 (e.g., a communications bus, cross-over bar, or network) to which the aforementioned devices/modules are connected.

Information transferred via communications interface 314 may be in the form of signals such as electronic, electromagnetic, optical, or other signals capable of being received by communications interface 314, via a communication link that carries signals and may be implemented using wire or cable, fiber optics, a phone line, a cellular phone link, a radio frequency link, and/or other communication channels. With such a communications interface, it is contemplated that the one or more processors 302 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4:
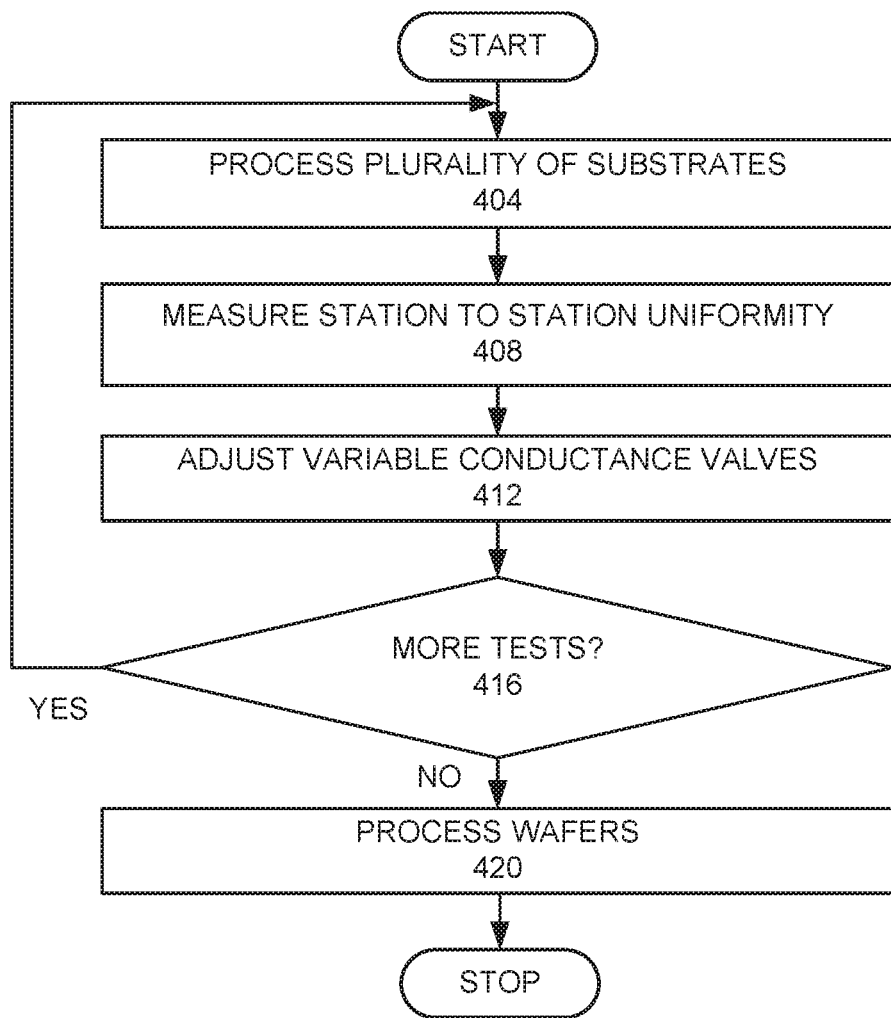
FIG. 4 is a flow chart of an embodiment.

FIG. 4 is a high level flow chart of a method used in an embodiment. A plurality of substrates 203 is processed in the first processing station 128 and the second processing station 132 (step 404). The substrates 203 may be test wafers, such as blank wafers or wafers with stacks and/or devices on the wafers for testing. The processed substrates 203 are measured to measure and determine station to station uniformity (step 408). The first, second, third, fourth, fifth, and sixth variable conductance valves 112, 116, 120, 124, 144, and 148 are adjusted to change the resistance of flow to adjust flow rates to improve station to station uniformity (step 412). If more tests are needed to check the results of the changes (step 416) then the process goes back to step 404. Otherwise, the first processing station 128 and the second processing station 132 are used to process substrates 203 in production (step 420). The substrates 203 may be production wafers used for producing devices instead of testing the stations.

In the example process chamber above, the first processing station 128 and the second processing station 132 are used for atomic layer deposition of silicon oxide ($SiO_2$). In the above example, the first processing station 128 is in a separate processing chamber than the second processing station 132. In the above example and in other types of substrate processing, station to station uniformity when different stations share a common gas source, is not always achieved. Without being bound by theory, it is believed that differences between stations such as different resistances in the gas flow systems, different volumes, different powers, or different temperatures cause differences in processing of wafers in different stations. It has been unexpectedly found that by changing the resistance of gas flow using the different variable conductance valves, station to station uniformity can be improved even if the nonuniformity is being caused by differences in the processing chambers other than differences in the resistances in the gas flow systems.

In other embodiments, a different number of stations may share a common gas source. In some embodiments, more than one processing station may be in a single chamber. Other embodiments may have different numbers of gas sources. For example, one embodiment may have a single gas source for two or more processing stations. Another example may have three or more gas sources for two or more processing stations.

In some embodiments, the variable conductance valves may be butterfly valves designed to adjust resistance in the variable conductance valve. In other embodiments, a series of different sized orifices may be used to adjust resistance to provide the variable conductance valve. In some embodiments, the variable conductance valve may be mechanically adjusted. In other embodiments, the variable conductance valve may be electronically adjusted. Electronically adjusted variable conductance valves may be adjusted by the controller 235. The processing of substrates, measuring the processed substrates, adjusting the variable conductance valves by the controller 235, and then processing additional substrates, provides a feedback loop. The first gas source 104 may have a mass flow controller. The second gas source 108 may have a mass flow controller. The variable conductance valves are separate from and different from mass flow controllers, since mass flow controllers are set to provide a flow rate, whereas adjustable variable conductance valves provide an adjustable flow resistance.

In another example, a single processing station may be connected to one or more gas sources, with a variable conductance valve between the single processing station and the one or more gas sources. In this example, even though the single processing station does not share gas sources with other single processing stations, the presence of a variable conductance valve may be used to improve station to station uniformity. For a process, a recipe may be provided. The recipe may be used for multiple stations. If the above station has a different volume or a heater is not correctly gauged, the provided recipe will have a different result than another station. It is believed that adjusting the variable conductance valve may be used to compensate for differences, such as different volumes or temperatures. Such a compensation would allow the processing station to provide a more uniform result with other processing stations for a given recipe.

Figure 5A:
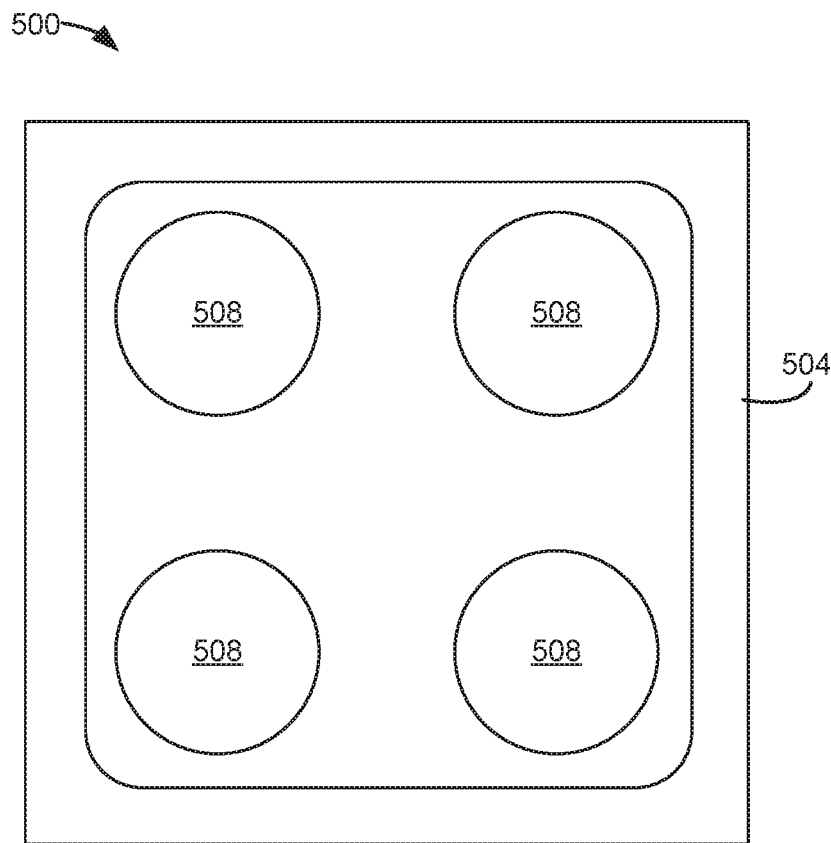
FIG. 5A is a top cut away view of another embodiment.
Figure 5B:
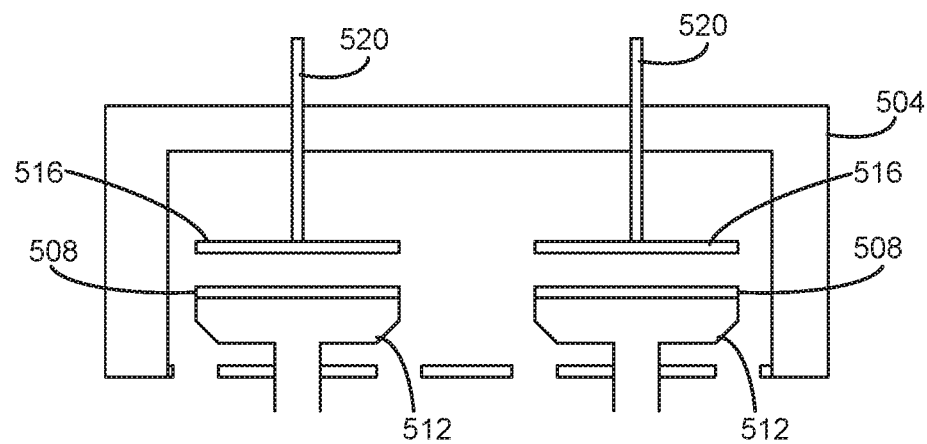
FIG. 5B is a cut away side view of the embodiment shown in FIG. 5A.

In another embodiment, four processing stations may share a gas source in a single processing chamber. FIG. 5A is a cut away top schematic view of a processing chamber 500 with four processing stations. The processing chamber 500 has a chamber wall 504. FIG. 5B is a cut away side view of the chamber. Within the chamber wall 504 are located four substrates 508 located at four processing stations within the processing chamber 500. Each processing station comprises a pedestal 512 for supporting a substrate 508, a gas outlet 516 for providing gas to the substrate 508, and a manifold 520 connecting the gas outlet 516 to a variable conductance valve and a mixing manifold (not shown).

Figure 6:
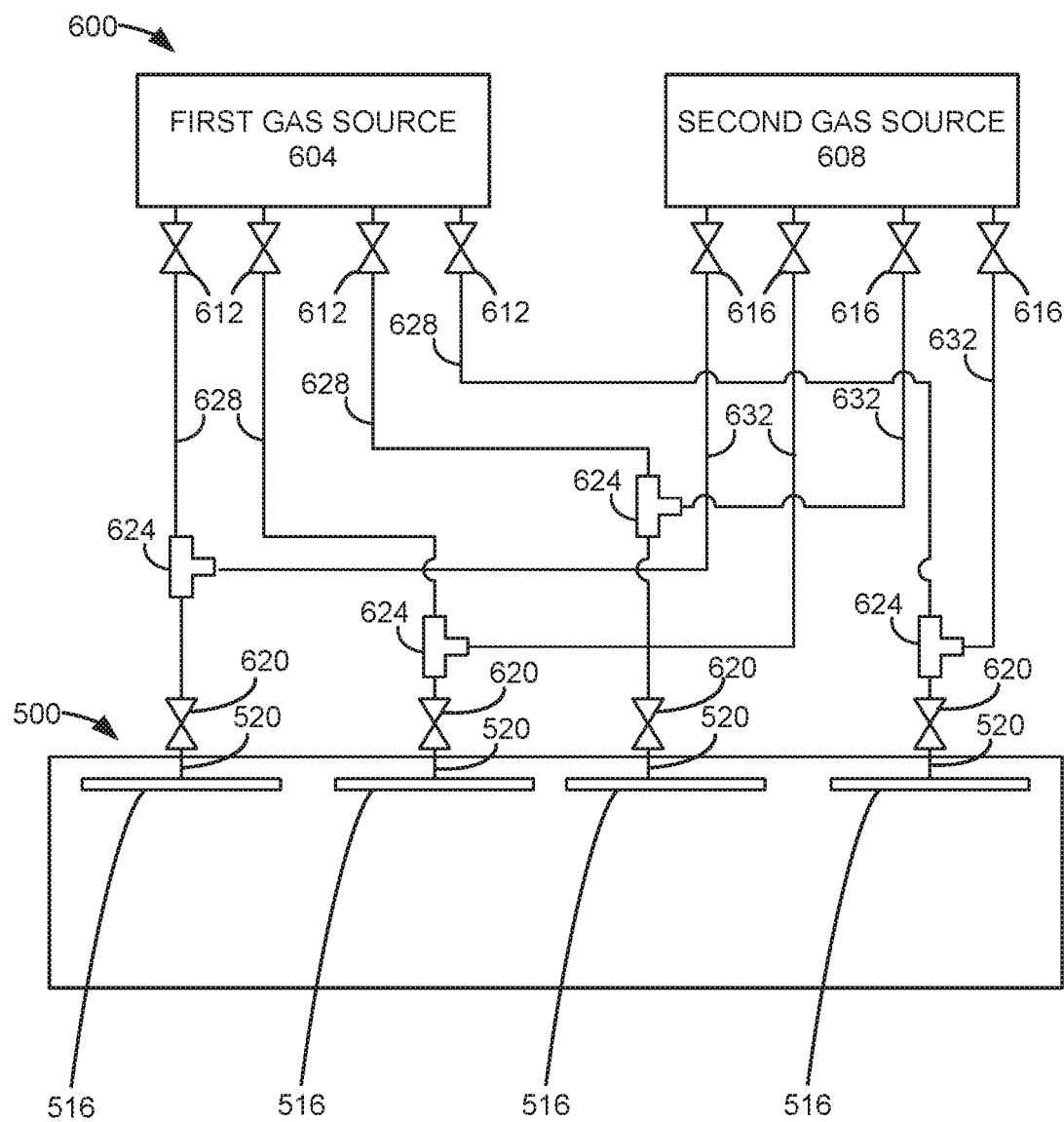
FIG. 6 is a schematic illustration of a gas system used in the embodiment shown in FIG. 5A.

FIG. 6 is a schematic view of a gas delivery system 600 that may be used for the processing chamber 500 in FIG. 5. In this example, the gas delivery system 600 has a first gas source 604 and a second gas source 608. The first gas source 604 is in fluid connection with four variable conductance valves 612, since in this example the first gas source 604 is shared between four gas outlets 516 for four processing stations (not shown). The second gas source 608 is in fluid connection with four variable conductance valves 616. Each of the four gas outlets 516 is connected through a manifold 520 to a variable conductance valve 620 and a mixing manifold 624, as shown. Each mixing manifold 624 is connected through manifolds 628 to a variable conductance valve 612 in fluid connection with the first gas source 604 and a manifold 632 to a variable conductance valve 616 in fluid connection with the second gas source 608.

This embodiment, allows the improvement of station to station uniformity for four processing stations connected to the same gas sources. It has been found that station to station nonuniformity in such systems is the most significant source of nonuniformity.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method of processing a plurality of stacks, in a processing system comprising first gas source, a first gas manifold connected to the first gas source, a second gas manifold connected to the first gas source, a first processing station with a first gas outlet, wherein the first gas outlet is connected to the first gas manifold, a second processing station with a second gas outlet, wherein the second gas outlet is connected to the second gas manifold, a first variable conductance valve between the first gas source and the first gas outlet along the first gas manifold, a second variable conductance valve between the first gas source and the second gas outlet along the second gas manifold, a first mixing manifold between the first variable conductance valve and the first gas outlet, along the first gas manifold, a second mixing manifold between the second variable conductance valve and the second gas outlet, along the second gas manifold, a second gas source, a third gas manifold connected between the second gas source and the first mixing manifold, a fourth gas manifold connected between the second gas source and the second mixing manifold, a third variable conductance valve connected between second gas source and the first mixing manifold along the third gas manifold, a fourth variable conductance valve connected between the second gas source and the second mixing manifold along the fourth gas manifold, a fifth variable conductance valve between the first mixing manifold and the first gas outlet, and a sixth variable conductance valve between the second mixing manifold and the second gas outlet, the method comprising adjusting the first variable conductance valve, the second variable conductance valve, the third variable conductance valve, the fourth variable conductance valve, the fifth variable conductance valve, and the sixth variable conductance valve to provide improved uniformity between the first processing station and the second processing station.

2. The method, as recited in claim 1, further comprising:
   processing substrates of test wafers in the first processing station and the second processing station;
   measuring the substrates; and
   determining station to station uniformity between the first processing station and the second processing station.

3. The method, as recited in claim 2, further comprising processing substrates of production wafers in the first processing station and the second processing station.

* * * * *